United States Patent [19]

Watanabe

[11] Patent Number: 4,631,707
[45] Date of Patent: Dec. 23, 1986

[54] MEMORY CIRCUIT WITH POWER SUPPLY VOLTAGE DETECTION MEANS

[75] Inventor: Takayuki Watanabe, Tokyo, Japan

[73] Assignee: NEC Corporation, Tokyo, Japan

[21] Appl. No.: 528,006

[22] Filed: Aug. 31, 1983

[30] Foreign Application Priority Data

Aug. 31, 1982 [JP] Japan .............................. 57-150844

[51] Int. Cl.⁴ ............................................... G11C 7/00
[52] U.S. Cl. ..................................... 365/226; 365/228
[58] Field of Search ........................ 365/226, 228, 229

[56] References Cited

U.S. PATENT DOCUMENTS 4,104,734  8/1978  Herndon ............................. 365/228
4,288,865  9/1981  Graham ............................. 365/229
4,399,524  8/1983  Muguruma et al. ................ 365/229

Primary Examiner—Joseph A. Popek
Attorney, Agent, or Firm—Sughrue, Mion, Zinn, Macpeak & Seas

[57] ABSTRACT

A memory circuit provided with a control circuit which controls operations of the memory circuit in such a manner that the memory circuit is automatically set in a stand-by state when a value of a power voltage is reduced in absolute value irrespectively of a control signal from the outside and which consumes no DC current is disclosed. The control circuit comprises a load element coupled between first and second terminals, a series circuit of first and second field effect transistors coupled between the second terminal and a third terminal, the first transistor being controlled by the control signal, the second transistor being adapted to be conducting when a value of the power voltage is sufficient for allowing a normal access operation, a means for connecting the first terminal to one of the power voltage and a reference voltage, and a means for connecting the third terminal to the other of the power voltage and the reference voltage.

16 Claims, 6 Drawing Figures

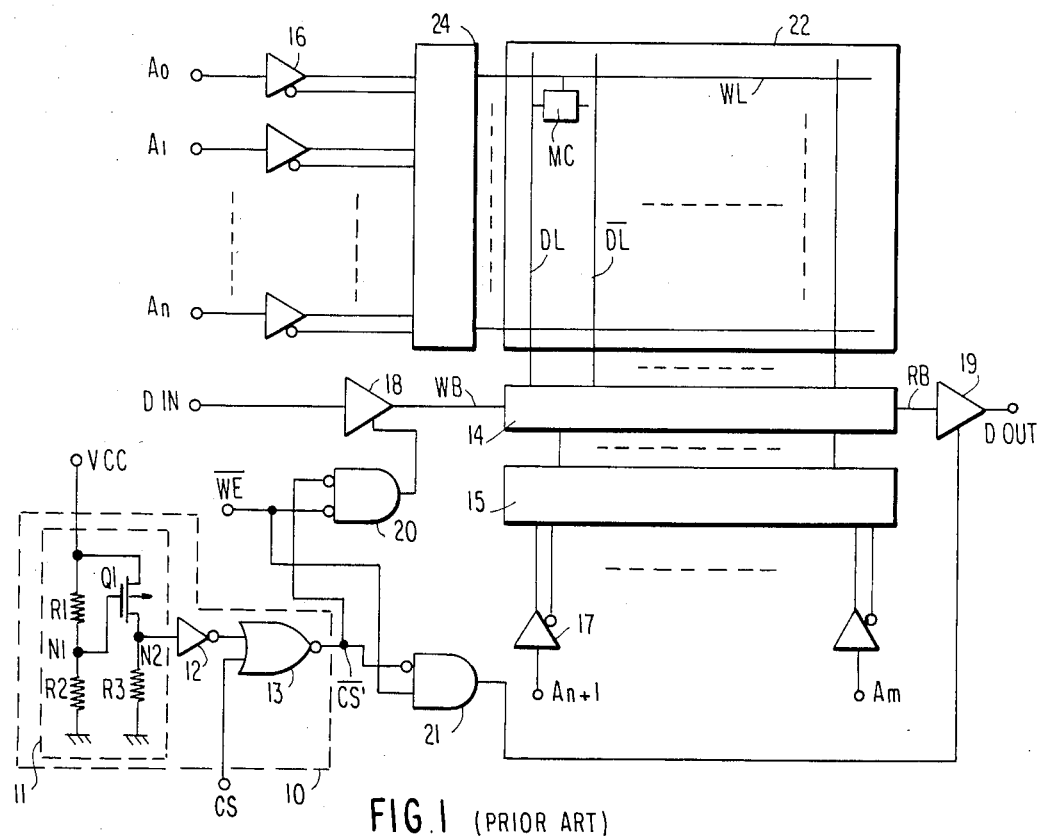
FIG.1 (PRIOR ART)
FIG.2
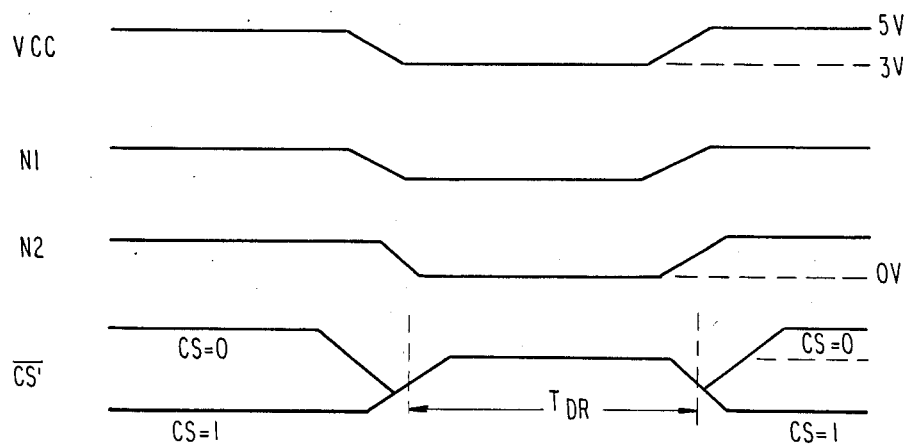

MEMORY CIRCUIT WITH POWER SUPPLY VOLTAGE DETECTION MEANS

BACKGROUND OF THE INVENTION

The present invention relates to a static type memory circuit having a stand-by mode, or "Data Retention Mode", for allowing stored information to be maintained by a back-up voltage of a smaller voltage value than a normal operation power voltage, and more particularly, to a memory circuit of the mentioned type having means for detecting reduction in a power supply voltage.

As is well known, a static type memory can operate at a high speed, but it requires a relatively large amount of power consumption. In this point of view, when a memory is not accessed from the outside, a value of the power supply voltage applied to the memory is reduced to a value which is enough to maintain information storage in memory cells but is not enough to perform write and read operations to and from the memory cells, introducing "Data Retention Mode" to the memory. The Data Retention Mode is initiated by turning a chip selection signal applied to the memory chip to an inactive level for disenabling peripheral circuits of the memory cell array such as decoder circuits and a read/write circuit, and by reducing the power voltage. Recently, such a memory has been proposed that is forced to be switched over into the Data Retention Mode even if the chip selection signal is in an active level, when the value of the power supply voltage drops down to a value equal to or near the value to which the power supply voltage is intentionally reduced in the Data Retention Mode. Such a forced Data Retention Mode is called as "Auto Data Retention Mode". The memory is provided with a voltage value detection circuit for detecting a drop in the power supply voltage for the Auto Data Retention Mode, and with a control circuit responsive to the chip selection signal and to the output of the voltage value detection circuit. With these circuits, even if the chip selection signal is in the active level, the state of the memory can be shifted to the Data Retention Mode by intentionally reducing the power voltage and the peripheral circuits are disenabled, thus enhancing the flexibility in controlling the memory. When the power voltage unintentionally drops, the peripheral circuits are automatically disabled by the Auto Data Retention Mode to protect the stored information. The voltage value detection circuit in the prior art memory comprises a voltage divider circuit composed of resistors serially connected between the power voltage and a reference voltage for dividing the power voltage and of an inverter circuit receiving the output of the voltage divider circuit and logically distinguishing the value of the power voltage between the normal operation mode and Data Retention Mode. The output of the inverter of the voltage value detection circuit is then applied to one input terminal of a NOR gate which receives the chip selection signal at the other input terminal. The NOR gate produces an internal chip selection signal for directly controlling the peripheral circuits. In this prior art voltage value detection circuit, however, a current always flows through the serially connected resistors both in the normal operation mode and in the Data Retention Mode, and therefore a considerable amount of power is inevitably consumed. This problem is more serious in the Data Retention Mode, because a battery is generally used as a back-up voltage source and its capacity is limited.

Furthermore, a relatively large number of circuit elements are required to generate the internal chip selection signal in the mentioned prior art.

It is an object of the present invention to provide memory circuit operable with a low power consumption both in the normal operation mode and in the Data Retention Mode.

It is another object of the present invention to provide a memory circuit which can be fabricated with high-density on a semiconductor chip.

It is still another object of the present invention to provide an improved mode control circuit for controlling operation modes of a memory.

SUMMARY OF THE INVENTION

A memory circuit according to the present invention comprises a voltage value detection circuit which includes a series connection of a chip selection signal detecting field effect transistor and a voltage value detecting field effect transistor. The gate of the former transistor receives a chip selection signal, and the latter transistor is adapted to be conducting when the potential at a power voltage terminal is in a first value and non-conducting when the potential at the power voltage terminal is in a second value smaller in absolute value than the first value, the second value being not enough to support the read/write operation of the memory circuit but enough to support information storage. This series connection is coupled via a load means between the power voltage terminal, and an output signal of the voltage value detection circuit is derived from the junction of the two transistors and the load means or from the junction between the two transistors.

According to the present invention, the voltage value detecting transistor is made non-conducting when the potential at the power voltage terminal is in the second value which brings the memory circuit into the Data Retention Mode, and hence no DC current flows the series connection in the voltage value detection circuit, resulting in a low power consumption.

Furthermore, the voltage value detection circuit can be fabricated by a small number of circuit elements, e.g. one load element and two transistors, and hence the integration density of the memory circuit can be enhanced.

According to the present invention, there is provided a memory circuit comprising a plurality of memory cells, a selection circuit for selecting at least one of the memory cells based on address information, a read circuit for operatively reading data from the memory cell or cells designated by the selection circuit, a write circuit for operatively writing data to the memory cell or cells designated by the selection circuit and an operation control circuit for controlling at least the read circuit and the write circuit in response both to a value of the power voltage variable between a first value and a second value smaller than the first value and to a chip selection signal having a first and second levels, the first value allowing the memory to normally operate, the second value inhibiting the memory from normally operating but allowing the memory to maintain stored data. The operation control circuit enabling and disenabling the write circuit and the read circuit in response to the first level and to the second level of the chip selection signal, respectively when the value of the power voltage is at the first value while the operation control circuit disenabling the write circuit and the read circuit when the value of the power voltage is at the second value irrespectively of the chip selection signal, the operation control circuit including a load element coupled between a first terminal receiving one of the power voltage and a reference voltage and a second terminal, and a series circuit of a first field effect transistor receiving the chip selection signal at its gate and a second field effect transistor adapted to be conducting only when the power voltage is at the first value between the second terminal and a third terminal receiving the other of the power voltage and the reference voltage in which the controls of the write circuit and the read circuit are conducted in response to a potential at the second terminal.

According to the above memory, only when the power voltage is at the first voltage and the memory is in the normal operation mode, the potential at the second terminal can be controlled by the first transistor in response to the chip selection signal. While when the power voltage is at the second value and memory is to be in Data Retention Mode, the second transistor is non-conducting so that the potential at the second terminal is determined through the load element independently on the chip selection signal so that the memory is automatically set at Data Retention Mode in which stored states of the memory cells are maintained but any access to the memory cells is inhibited. In this instance, no DC current flows the series circuit of the first and second transistors in the operation control circuit at least during Data Retention Mode. Accordingly, the power consumption in the operation control circuit is remarkably reduced. Furthermore, the operation control circuit can be fabricated by a small number of circuit elements so that the integration density of the memory can be enhanced.

DESCRIPTION OF THE DRAWINGS

FIG. 1 is a block diagram showing a memory circuit according to the prior art;

FIG. 2 is a waveform diagram showing the operations of the memory of FIG. 1;

DESCRIPTION OF PRIOR ART

Figure 3:
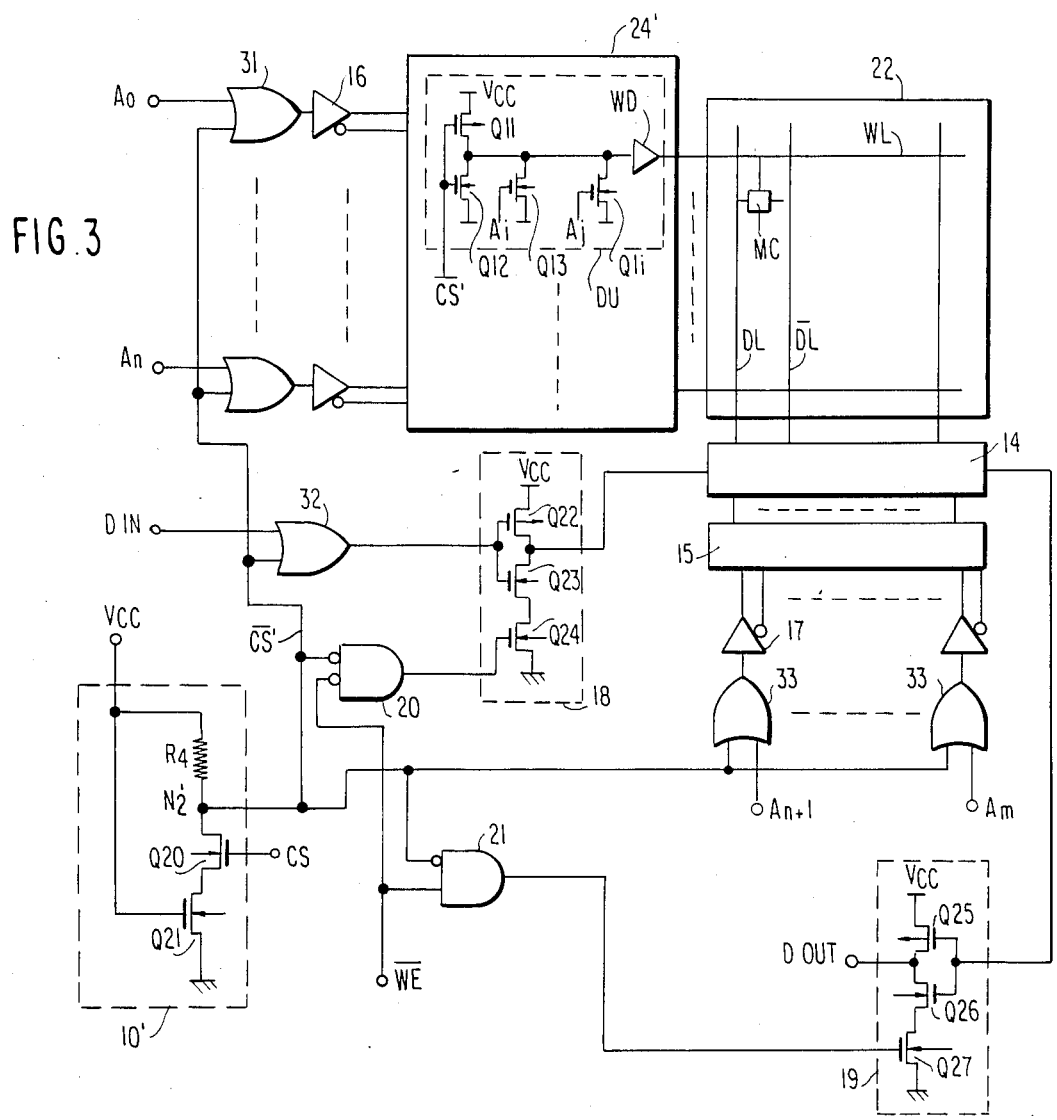
FIG. 3 is a block diagram showing a memory circuit according to one embodiment of the present invention.

With reference to FIG. 1, a memory according to the prior art will be described.

A memory cell array 22 includes a plurality of memory cells MC which are arranged in a matrix of word lines WL in rows and digit lines DL in columns. A plurality of row address input $A_0$-$A_n$ are applied to a row decoding circuit 24 through address inverter buffers 16. A column selection circuit 14 selectively connects one of the digit lines DL to a write data line WB and/or a read data line RB under control of a column decoder 15 to which column address inputs $A_{n+1}$-$A_m$ are applied through column address inverter buffers 17. A mode control circuit 10 generates an internal control signal $\overline{CS'}$ in response to a chip selection signal CS from the outside and a value of a power voltage $V_{cc}$. The signal $\overline{CS'}$ is applied to an inverting input of a AND gate 21 receiving a write control signal $\overline{WE}$ at its another input, and to an inverting input of an AND gate 20 receiving the write control signal $\overline{WE}$ at its other inverting input. The output of the gate 20 is used to operatively enable a data input buffer 18 for supplying data to be written in a write operation. The buffer 18 includes a series circuit of a P-channel transistor $Q_{22}$ and N-channel transistors $Q_{23}$ and $Q_{24}$, and it is enabled when the transistor $Q_{24}$ is conducting. The output of the AND gate 21 is used to operatively enable an output buffer 19 receiving a read-out signal via the read data line RB. The buffer 19 includes a P-channel transistor $Q_{25}$ and N-channel transistors $Q_{26}$ and $Q_{27}$, and it is enabled when the transistor $Q_{27}$ is conducting. The mode control circuit 10 includes a voltage value detection circuit 11, an inverter 12 and a NOR gate 13 receiving the chip selection signal CS and an output of the inverter 12. The voltage value detection circuit 10 includes a voltage divider composed of resistors $R_1$ and $R_2$ connected between the power voltage $V_{cc}$ and a ground potential and a series circuit of a P-channel field effect transistor $Q_1$ and a resistor $R_3$. With reference to FIG. 2, the operation of the memory will be described. When the value of the power voltage $V_{cc}$ is in a normal operation range, e.g. 4.5-5.5 V, a voltage drop across the resistor $R_1$, i.e. a voltage difference between the voltage $V_{cc}$ and a voltage at a node $N_1$ is larger than a threshold voltage of the transistor $Q_1$ in absolute value so that a voltage at a node $N_2$ is larger than a logic threshold of the inverter in absolute value. Accordingly, the output of the inverter 12 necessarily takes logic "0" in the normal operation mode and hence the state of the signal $\overline{CS'}$ is determined by the chip selection signal. For example, if the chip selection signal CS is at the logic "1", then the signal CS' is at the logic "0" so that the memory is in active state. On the contrary, if the chip selection signal CS is at the logic "0" level, the signal $\overline{CS'}$ becomes the logic "1" so that the memory takes a stand-by state. In stand-by state, the input buffer 18 and the buffer 19 are inhibited so as not to affect the stored states of the memory cells.

When the value of the power voltage $V_{cc}$ drops from that in the normal operation mode to a back-up voltage e.g. 3 V, and the voltage drop across the resistor $R_1$ becomes smaller than the threshold voltage of the transistor $Q_1$, then the transistor $Q_1$ becomes non-conducting. Therefore, the potential at the node $N_2$ becomes the ground level i.e. logic "0". As a result, the signal $\overline{CS'}$ becomes the logic "1" irrespective of the state of the chip selection signal CS so that the memory enters the stand-by state, i.e. Data Retention Mode. As described above, the memory of FIG. 1 can be automatically shifted to Data Retention Mode by simply reducing the value of the power voltage $V_{cc}$. However, in the memory of FIG. 1, a DC current always flows through the resistors $R_1$ and $R_2$, both in the normal operation mode and in Data Retention Mode. Accordingly, the power consumption of the memory of the prior art is large. Furthermore, the mode control circuit 10 is composed of a relatively large number of circuit elements and that is a disadvantage in view of the desire to fabricate the memory with high-density.

DETAILED DESCRIPTION OF THE INVENTION

With reference to FIG. 3, a memory according to one embodiment of the present invention will be described.

The memory circuit of FIG. 3 is fabricated on a semiconductor chip. In FIG. 3, the portions corresponding to those in FIG. 1 are designated by the same reference numbers used in FIG. 1. In the present invention, in place of the mode control circuit 10 in FIG. 1, a mode control circuit 10' is employed. The mode control circuit 10' according to the invention includes a load resistor $R_4$ connected between the power voltage $V_{cc}$ and a node $N_2'$, and a series circuit of an N-channel field effect transistor $Q_{20}$ receiving the chip select signal CS from the outside at a gate thereof and an N-channel field effect transistor $Q_{21}$ having a gate and being coupled to the power voltage $V_{cc}$ coupled between the node $N_2'$ and the ground potential. From the node $N_2'$ the internal control signal $\overline{CS'}$ is generated. In this embodiment, the signal $\overline{CS'}$ is also applied to OR gates 31, each coupled between one of the address inputs $A_0$-$A_n$ and a corresponding one of the row address inverter buffers 16, and to OR gates 33 each coupled between one of the column address inputs $A_{n+1}$-$A_m$ and a corresponding one of the column address inverter buffers 17. In the row decoding circuit 24', each of the decoding units DU for driving the corresponding one of the word lines WL is composed of a P-channel field effect transistor $Q_{11}$ and an N-channel field effect transistor $Q_{12}$ coupled between the power voltage $V_{cc}$ and the ground potential and both receiving the signal $\overline{CS'}$ at their gates, and a plurality of N-channel field effect transistors $Q_{13}$ ... $Q_{li}$ connected in parallel with the transistor $Q_{12}$. The transistors $Q_{13}$ ... $Q_{li}$ receive the row address signals from the row address inverter buffers. In the mode control circuit 10', a threshold voltage of the N-channel transistor $Q_{21}$ is selected to a value which is lower than the value of the power voltage $V_{cc}$ in the normal operation mode and larger than the value of the power voltage $V_{cc}$ in Data Retention Mode. In the normal operation mode, the transistor $Q_{21}$ is conducting. Therefore, when the chip selection signal CS is at the logic "1", the transistor $Q_{20}$ is conducting so that the potential at the node $N_2'$, i.e. signal $\overline{CS'}$, is at the logic "0" through the conducting transistors $Q_{20}$ and $Q_{21}$, and the memory operates in the active mode. In the active mode, the OR gates 31 directly transfer the row address input $A_0$-$A_n$ to the row address inverter buffers 16 and the OR gates 33 directly transfer the column address inputs $A_{n+1}$-$A_m$ to the column address inverter buffers 17. Also, in the row decoding circuit 24', the respective decoding units DU are enabled. When the operation is a read operation, the write control signal $\overline{WE}$ is at the logic "1", and hence the output of the AND gate 21 is at the logic "1" while the output of the AND gate 20 is at the logic "0". Therefore, the read buffer 19 is enabled while the write buffer 18 is disenabled. When a write operation is to be performed, the write control signal $\overline{WE}$ is at the logic "0" and hence the write buffer 18 is enabled with the read buffer 19 disenabled.

When the chip selection CS becomes the logic "0" under the power voltage of the normal operation range, the transistor $Q_{20}$ becomes non-conducting to make the signal $\overline{CS'}$ the logic "1" so that the memory takes a stand-by state, in which the outputs of the OR gates 31 and 33 are all logic "1" irrespective of the address inputs so that changes of the states of the address inverter buffers 16 and 17 are inhibited. Accordingly, the power consumption generated in the address inverter buffers 16 and 17 can be avoided. Simultaneously, the load transistor $Q_{11}$ in the decoding unit DU is turned off and both the read buffer 19 and the write buffer 18 are disabled.

When the value of the power voltage $V_{cc}$ changes from the value e.g. 5 V for the normal operation mode to the value e.g. 3 V for Data Retention Mode, the transistor $Q_{21}$ becomes non-conducting. Accordingly, the signal $\overline{CS'}$ becomes logic "1" irrespective of the chip selection signal CS so that the memory is shifted to the stand-by mode and the peripheral circuits such as the address inverter buffers 16 and 17, the read buffer 19 and the write buffer 18 are disabled. According to the present invention, there is no DC current path in the mode control circuit 10' at least during Data Retention Mode so that the memory operable with a low power consumption is obtained. Furthermore, the control circuit 10' can be fabricated with a small number of circuit elements.

With reference FIGS. 4 to 6, other embodiments of the mode control circuit 10' of FIG. 3 will be explained.

Figure 4:
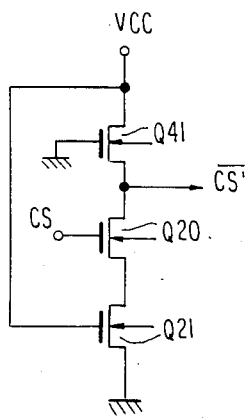
FIGS. 4 to 6 show other examples of the control circuit 10' of FIG. 3 according to the present invention.

A mode control circuit shown in FIG. 4 is obtained by replacing the resistor $R_4$ of FIG. 3 with a P-channel field effect transistor $Q_{41}$ having a gate connected to the ground potential. The operation of this mode control circuit is substantially the same as that of the circuit 10' of FIG. 3.

Figure 5:
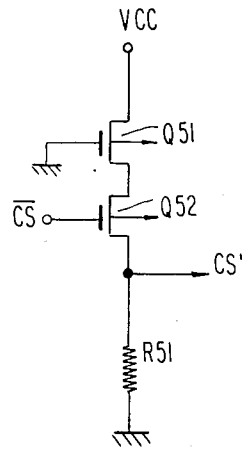

A mode control circuit of FIG. 5 is the case where the logic system with respect to the chip selection signal CS and the internal control signal $\overline{CS'}$ of FIG. 3 is inverted. Namely, a series circuit of P-channel field effect transistors $Q_{51}$ and $Q_{52}$ is connected between a node $N_2''$ and the power voltage $V_{cc}$ and a resistor $R_{51}$ is connected between the node $N_2''$ and the ground potential. In this circuit, when the value of the power voltage $V_{cc}$ changes from the value in the normal operation mode to that in Data Retention mode, the transistor $Q_{51}$ becomes non-conducting so that the signal CS' becomes the inactive level i.e. logic "0", because the threshold voltage of the transistor $Q_{51}$ is set slightly larger than the voltage value of the power voltage in Data Retention Mode.

Figure 6:
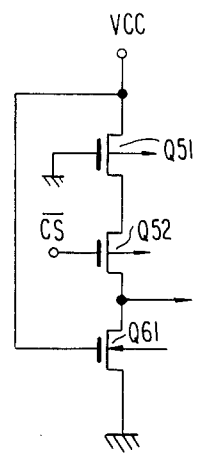

A mode control circuit of FIG. 6 is obtained by replacing the resistor $R_{51}$ of FIG. 5 with an N-channel transistor $Q_{61}$ having a gate connected to the power voltage. An operation of this circuit is similar to that of FIG. 5.

Although the explanation of the present invention has been performed by way of examples, the present invention is not limited to the mentioned embodiment but applicable to different kind of memory circuits.

I claim:
1. A memory circuit comprising:
a matrix of memory cells,
an operation control terminal said terminal adapted to assume at least a first signal level,
a power voltage terminal, said terminal having a voltage value at least within a normal range or a retention range,
a reference voltage terminal,
means coupled to said matrix and said power voltage terminal for supplying a power voltage to said memory cells,
circuit means operable to read information from and write information into said memory cells, said circuit means being operable when a potential at said power voltage terminal is within normal voltage range,
a detection means including a series connection of an impedance element and first and second field effect transistors coupled between said power voltage terminal and said reference voltage terminal, a gate of said first transistor being coupled to said operation control terminal, a gate of said second transistor being coupled to said power voltage terminal, said first transistor conducting when said operation control terminal assumes a first signal level, said second transistor assuming a conducting state when a potential at said power voltage terminal is within said normal voltage range and a non-conducting state when a potential at said power voltage terminal is outside said normal voltage range, said detection means generating a detection signal ohly when both of said first and second transistors assume conducting states simultaneously, and means coupled to said detection means and to said circuit means for enabling said circuit means in response to said detection signal.

2. The memory circuit according to claim 1, in which said enabling means includes an OR gate having a first input terminal receiving a logic signal and a second input terminal receiving said detection signal.

3. The memory circuit according to claim 1, further comprising a selection circuit for designating at least one of said memory cells, means for receiving a write control signal, and control means for controlling said circuit means so as to conduct a write operation when said write control signal is at a first logic level.

4. The memory circuit according to claim 1, further comprising a selection circuit for selecting at least one of said memory cells, means for receiving a write control signal, and control means for controlling said circuit means so as to conduct a read operation when said write control signal is at a second logic level.

5. The memory circuit according to claim 1, further comprising a plurality of address input terminals, a plurality of address inverter buffers, a plurality of gate means each coupled between one of said address input terminals and an input of the corresponding one of said address inverter buffers, and gate control means for controlling said gate means in response to said detection signal.

6. The memory circuit according to claim 1, which said impedance element is composed of a third field effect transistor.

7. The memory circuit according to claim 1, which said circuit means includes means for receiving a write control signal, a read circuit for operatively reading data from a selected memory cell, a write circuit for operatively writing data to the selected memory cell, first control means for selectively enabling said write circuit only when said detection signal is present and said write control signal is the level designating a write operation, and second control means for selectively enabling said read circuit only when said detection signal is present and said write control signal is the level designating a read operation.

8. A memory circuit comprising an array of a plurality of memory cells, a peripheral circuit for conducting an accessing operation with respect to said memory cells, means for receiving a control signal, a pair of power voltage terminals receiving a power voltage and a control circuit coupled to said receiving means and said pair of power voltage terminals for controlling said peripheral circuit in response both to the received control signal and said power voltage, said power voltage being changed between a first value for conducting a normal access operation to said memory and a second value for retaining data stored in said memory cells without being accessed, said control circuit including a load element coupled between first and second terminals, a series circuit of first and second field effect transistors coupled between said second terminal and a third terminal, a gate of said first transistor being supplied with said control signal, a gate of said second transistor being coupled to one of said power voltage terminals, control means coupled to said load element for controlling said peripheral circuit, means for connecting said first terminal to one of said pair of power voltage terminals, and means for connecting said third terminal to the other of said pair of power voltage terminals.

9. An integrated circuit chip comprising at least one logic circuit, means for receiving a chip selection signal, a pair of power voltage terminals, a series connection of first and second field effect transistors, means for connecting a gate of said first transistor to said receiving means, means for connecting a gate of said second transistor to one of sAid pair of voltage terminals, means for connecting said series connection between said pair of power voltage terminals, detection means coupled to said series connection for producing an internal signal only when both of said first and second transistors are conducting simultaneously, and control means coupled to said detection means and to said at least one logic circuit for placing said at least one logic circuit in an operating state when said internal signal is present and in a non-operating state when said internal signal is not present.

10. The integrated circuit chip according to claim 9 in which said detection means includes an impedance element coupled to said series connection in series.

11. The integrated circuit chip according to claim 9, in which said control means includes a gate circuit having a first input terminal receiving the output of said detection means and a second input terminal receiving a logic signal to be applied to said at least one logic circuit.

12. The integrated circuit chip according to claim 9, in which said logic circuit includes a logic section having at least one input transistor receiving a logic signal and a switch means coupled between one end of said logic section and one of said pair of power voltage terminals.

13. A voltage value detection circuit comprising a power voltage terminal, a reference voltage terminal, a signal input terminal, an output terminal, a load element coupled between said power voltage terminal and said output terminal, a series circuit of first and second transistors coupled between said output terminal and said reference voltage terminal, means for connecting a gate of said first transistor to said signal input terminal, and means for connecting a gate of said second transistor to said power voltage terminal, said second transistor assuming a conductive state when a voltage value at said power voltage terminal is equal to or greater than a predetermined value and a non-conductive state when the voltage value at said power voltage terminal is less than said predetermined value, wherein the voltage value at said power voltage terminal is detected to be equal to a greater than said predetermined value when said output terminal assumes a level substantially equal to the voltage of said reference voltage and when said first transistor is rendered conductive by a potential at said signal input terminal.

14. A memory circuit comprising a matrix of memory cells, a plurality of address input terminals for receiving address signals, a power voltage terminal, a voltage value detection circuit coupled to said power voltage terminal, said detection circuit generating a first signal when said power voltage terminal is at a predetermined potential or more and a second signal when said power voltage terminal is less than said predetermined potential, selection means for selecting said memory cells, and a plurality of gating means coupled between said address input terminals and said selection means, each of said gating means having a first input terminal receiving one of said address signals and a second input terminal coupled to said detection means and applying said one of said address signals to said selection means in response to said first signal.

15. The memory circuit according to claim 14 in which each of said gating means includes an OR circuit.

16. The memory circuit according to claim 14, further comprising a chip control terminal for receiving a chip control signal, a logic circuit receiving the output of said detection means and said chip control signal, and a data output circuit coupled to said selection means for outputting data from the selected memory cell in response to an output of said logic circuit.

* * * * *

UNITED STATES PATENT AND TRADEMARK OFFICE
CERTIFICATE OF CORRECTION

PATENT NO. : 4,631,707
DATED : December 23, 1986
INVENTOR(S) : Takayuki WATANABE It is certified that error appears in the above-identified patent and that said Letters Patent is hereby corrected as shown below:

Column 4, line 32, delete "then the signal $\overline{CS}$'is at the logic" and insert --then the signal $\overline{CS}$' is at the logic--;

Column 7, line 8, delete "ohly" and insert --only--;
Claim 1

Column 7, line 37, after "1," insert --in--;
Claim 6

Column 7, line 40, after "1," insert --in--;
Claim 7

Column 7, line 56, after "terminal" insert --for--;
Claim 8

Column 8, line 14, delete "sAid" and insert --said--;
Claim 9

Signed and Sealed this

Eighth Day of September, 1987

Attest:

DONALD J. QUIGG

Attesting Officer

Commissioner of Patents and Trademarks